United States Patent [19]
Rodder

[11] Patent Number: 5,108,935
[45] Date of Patent: Apr. 28, 1992

[54] REDUCTION OF HOT CARRIER EFFECTS IN SEMICONDUCTOR DEVICES BY CONTROLLED SCATTERING VIA THE INTENTIONAL INTRODUCTION OF IMPURITIES

[75] Inventor: Mark S. Rodder, Dallas, Tex.

[73] Assignee: Texas Instruments Incorporated, Dallas, Tex.

[21] Appl. No.: 614,775

[22] Filed: Nov. 16, 1990

[51] Int. Cl.$^5$ .................. H01L 21/328; H01L 21/336
[52] U.S. Cl. ........................ 437/24; 437/31; 437/32; 437/41; 437/44; 437/81
[58] Field of Search ............ 437/24, 27, 28, 29, 437/30, 40, 41, 44, 31, 32, 81; 357/23.3, 34

[56] References Cited

U.S. PATENT DOCUMENTS

| | | | |
|---|---|---|---|
| 4,047,976 | 9/1977 | Bledsoe et al. | 437/24 |
| 4,111,719 | 9/1978 | Mader et al. | 437/24 |
| 4,133,701 | 1/1979 | Greenstein et al. | 437/24 |
| 4,144,100 | 3/1979 | MacIver et al. | 437/24 |
| 4,682,407 | 7/1987 | Wilson et al. | 437/24 |
| 4,837,173 | 6/1989 | Alvis et al. | 437/44 |
| 4,923,824 | 5/1990 | Fertig et al. | 437/44 |

FOREIGN PATENT DOCUMENTS

| | | | |
|---|---|---|---|
| 0035598 | 9/1981 | European Pat. Off. | 437/24 |
| 1966237 | 1/1972 | Fed. Rep. of Germany | 437/24 |
| 0220814 | 4/1985 | Fed. Rep. of Germany | 437/24 |
| 2578096 | 8/1986 | France | 437/24 |
| 0055371 | 5/1979 | Japan | 437/24 |
| 0110226 | 9/1981 | Japan | 437/24 |
| 0055072 | 3/1984 | Japan | 437/24 |
| 0042960 | 3/1986 | Japan | 437/24 |
| 0034937 | 2/1990 | Japan | 437/24 |

OTHER PUBLICATIONS

Ghandhi, *VLSI Fabrication Principles*, John Wiley & Sons, 1983, pp. 305 and 324.
Hot Carrier Induced Degradation Mode Depending on the LDD Structure in NMOSFETs; Yoshida et al.; IEEE, 1987, pp. 42-47.
Suppression of Hot-Carrier Degradation in Si MOSFETs by Germanium Doping; Kwok K. Ng et al.; IEEE, vol. 11, No. 1, Jan. 1990, pp. 45-47.
Design and Characteristics of the Lightly Doped Drain-Source (LDD) Insulated Gate Field-Effect Transistor; IEEE, vol. ED-27, No. 8, Aug. 1980; Ogura et al., p. 1359.
Hot-Electron Substrate-Current Generation During Switching Transients; Hsu et al., IEEE; vol. ED 32, No. 2, Feb. 1985, p. 394.
A New LDD Transistor with Inverse T Gate Structure, Huang et al.; IEEE, Apr. 1987, pp. 451-453.

*Primary Examiner*—Robert Kunemund
*Assistant Examiner*—M. Wilczewski
*Attorney, Agent, or Firm*—Stanton C. Braden; Rene E. Grossman; Richard L. Donaldson

[57] ABSTRACT

This invention discloses a method for reducing hot carriers in a transistor structure by means of increasing the scattering rate of the carriers. The increased scattering rate is accomplished by introducing scattering sites comprising of non-conventional dopants, an element which is not boron, phosphorous, or arsenic, into the base or channel region of a transistor.

4 Claims, 1 Drawing Sheet

REDUCTION OF HOT CARRIER EFFECTS IN SEMICONDUCTOR DEVICES BY CONTROLLED SCATTERING VIA THE INTENTIONAL INTRODUCTION OF IMPURITIES

FIELD OF THE INVENTION

The invention pertains to integrated circuit fabrication, and more particularly to a semiconductor device with reduced generation of hot carriers and the process of fabrication thereof.

BACKGROUND OF THE INVENTION

Using present semiconductor device technology, problems arise as semiconductor devices are scaled to smaller dimensions due to hot carriers and the associated changes in device characteristics during device operation.

Generation of hot carriers increases as the electric field in the semiconductor devices increases. In current semiconductor technology, a common approach for reducing generation of hot carriers is to reduce the magnitude of the electric field in the appropriate region of high electric field. The reduction of the electric field reduces the kinetic energy of the carrier, and therefore limits the number of high energy, "hot", carriers in the semiconductor device.

In present MOSFET technology, the reduction of the magnitude of the electric field in the appropriate region of the semiconductor device has been attempted using three main approaches. First, conventional dopant impurities, such as arsenic, phosphorous, or boron, of a type opposite to that of the well dopant are introduced to form a lightly doped spacer region (LDD) near the more heavily doped source/drain regions. Second, external bias voltages can be reduced. Third, structural changes in the basic MOSFET structure have been considered such as increased gate oxide thickness between the MOSFET gate and source/drain regions to reduce the electric field in these regions.

Several problems exist in the present techniques for reducing hot carrier generation and associated changes in device characteristics by means of reducing the electric field. The introduction of a lightly doped spacer region will increase the parasitic resistance, increase the susceptibility of variations in the device characteristics during operation due to changes in the parasitic resistance caused by the hot carriers, and constrain the design of devices due to the amount of area needed for the spacer region to effectively reduce hot carrier generation.

The other two methods which are currently used to reduce hot carrier generation also have problems. Reducing the external bias voltage will increase the susceptibility of the device to external noise and decrease the speed of the device. Structural modifications are not practical or possible for every device, and at least some device degradation occurs in the devices where the modifications are possible. For example, in most MOSFET devices, the thickness of the oxide between the gate and the drain/source could be increased, by thermal oxidation, to reduce the generation of the hot carriers. This process is not very controllable and could, therefore, degrade the device by reducing the current flow.

SUMMARY OF THE INVENTION

A semiconductor device which has reduced hot carrier generation is made by a process employing the introduction of scattering sites, which are comprised of non-conventional dopants. The invention described here overcomes the problems of having to utilize a lightly doped spacer region of particular length, reduce the external bias, or modify the basic structure of a semiconductor device in order to reduce hot carrier generation. The introduction of scattering sites, which can be selectively introduced, facilitates fabrication and is applicable to a variety of semiconductor devices, not solely MOSFET's.

The scattering sites can be introduced during material deposition or growth of the semiconductor device structure. Additionally, scattering sites can be introduced after material deposition or growth of the semiconductor device structure by means including implantation. The introduction of impurities is possible in all semiconductor device structures including lateral and vertical structures and can be a controlled localized introduction or a blanket layer of scattering sites.

An important technical advantage of the method for fabricating a semiconductor device of the present invention is the generation of hot carriers is reduced in a desired region or regions of the device by utilization of increased carrier scattering, which reduces problems associated with sole emphasis on the reduction of the electric field.

DETAILED DESCRIPTION OF THE INVENTION

The present invention provides a method for reducing hot carrier generation in semiconductor devices by means of increased scattering of carriers for which problems associated with sole emphasis on reducing the electric field are reduced.

Figure 1:
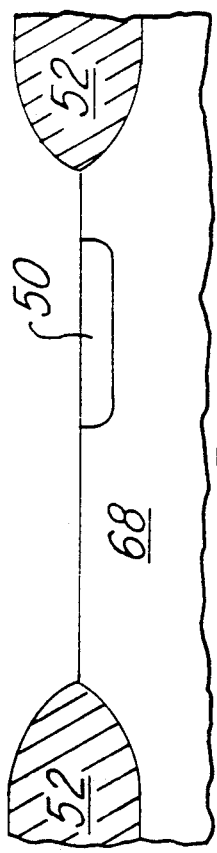
FIGS. 1 through 3 are cross-sectional side views showing the processing steps of a first preferred embodiment of the present invention wherein the introduction of the scattering sites occurs concurrently with the doping of the lightly doped spacer regions and after the formation of the gate.
Figure 2:
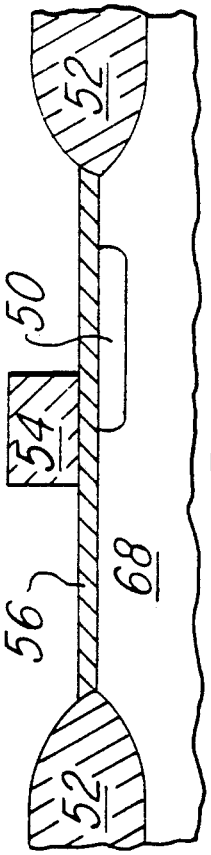
Figure 3:
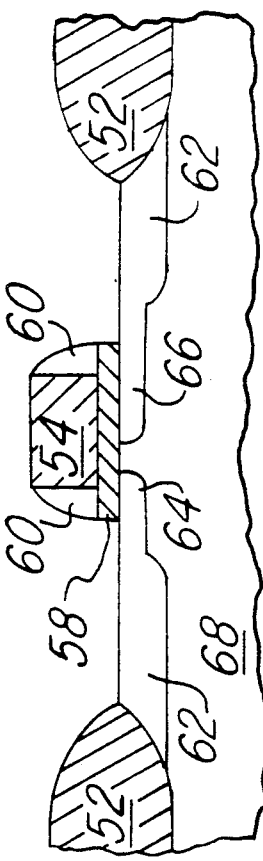
Figure 4:
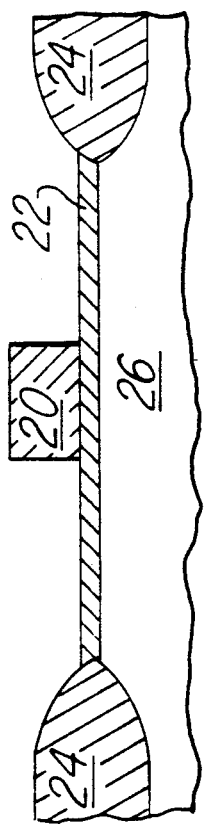
FIGS. 4 through 6 are cross sectional side views showing the processing steps of a second preferred embodiment of the present invention wherein the introducing of the scattering sites occurs prior to the formation of the gate.
Figure 5:
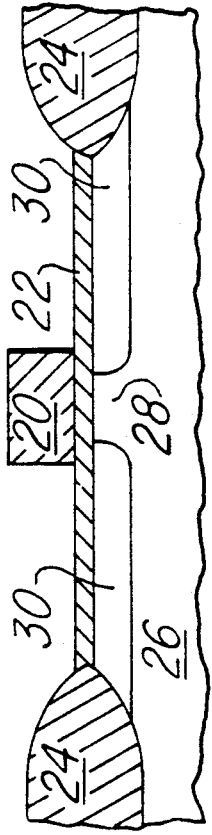
Figure 6:
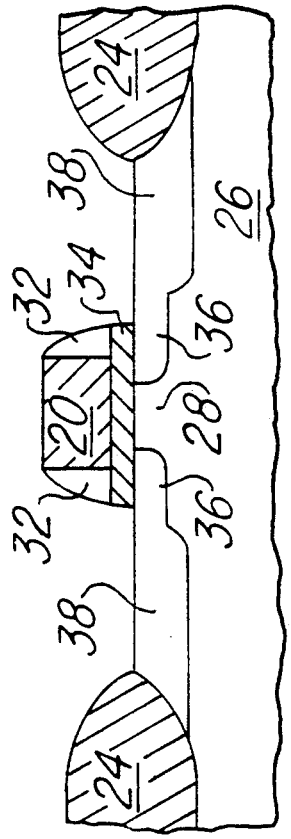

FIGS. 1 through 3 are cross sectional diagrams showing the preferred embodiment of the present invention and the method of forming the same. FIGS. 4 through 6 are cross sectional diagrams showing a second preferred embodiment of the invention.

FIG. 1 illustrates a substrate region 26 after a process stage. Insulating regions 24 are formed on the substrate 26. This is typically accomplished by growing a field oxide on the silicon substrate 26, after the substrate has been masked by a patterned layer. The masking layer is used so that the oxide will grow only in a specific area. A gate insulating layer 22 is then formed on the surface of the substrate 26 between the two insulating regions 24. This gate insulating layer 22 is typically 50 to 200 angstroms thick. A layer of polysilicon is deposited on the gate insulating layer 22 and the insulating region 24 and is etched to the desired configuration. The remaining polysilicon structure forms a gate 20, which is typically highly doped.

Referring to FIG. 2, using a masked implant, shallow junction regions 30, which may serve as lightly doped spacer regions, are formed in the region of the substrate between the insulating region and the gate. The shallow junction region 30 is typically doped with arsenic or phosphorus for NMOS transistors with a p-type substrate and boron for PMOS transistors with an n-type substrate, but is not limited to these dopants. The surface concentration levels for these dopants is typically between $10^{17}$ and $10^{19}/cm^3$. The depth of the shallow junction is on the order of 0.2 μm or less. Scattering sites are introduced into the shallow junction regions 30. The scattering sites are comprised of any one of the non-conventional dopants, typically fluorine. The concentration of the non-conventional dopant is between $10^{17}$ and $10^{20}/cm^3$.

Referring to FIG. 3, side wall insulators 32 are formed. Typically, these sidewall insulators 32 comprise of an oxide. After the formation of the sidewall insulators 32 and the deposition of a screen oxide (not shown), the source/drain regions 38 are formed. These are typically formed by doping the source/drain region 38 with arsenic or phosphorus for NMOS transistors and boron for PMOS transistors. Once the source/drain regions are formed, the screen oxide (not shown) is etched away in the region between the insulating region 24 and the sidewall insulator 32. Standard multilevel metal processing completes the process flow.

A second preferred embodiment of the present invention is shown in FIGS. 4 through 6. Referring to FIG. 4, insulating regions 52 are formed on substrate 68 in the same manner as was described for FIG. 1. Scattering sites are then introduced in region 50 in substrate 68. The scatterers are introduced by masked or focused ion beam implantation and comprise of any one of the non-conventional dopants.

Referring to FIG. 5, the gate insulating layer 56 is formed on the substrate 68 between the two insulating regions 52. A gate 54 is formed on the gate insulating layer 56 by first depositing a polysilicon layer atop of the gate insulating layer 56 and the insulating region 52, then etching off the regions of the polysilicon to achieve the desired configuration of the gate 54.

Referring to FIG. 6, the lightly doped spacer regions 64 and 66 are formed by introducing conventional dopants, arsenic or phosphorous for NMOS transistors and boron for PMOS transistors, into the substrate in the appropriate areas. Sidewall insulators 60 are formed followed by the deposition of a screen oxide (not shown), and the drain 68 and source 62 regions are formed by doping the regions between the sidewall insulator 60 and the insulating regions 52 with conventional dopants. The screen oxide (not shown) is etched from the regions between the sidewall insulators 56 and the insulating regions 52. Standard multilevel metal processing completes the process flow.

For example, scattering sites are introduced after the formation of the side wall insulators.

Although specific embodiments of the present invention are herein described, they are not to be construed as limiting the scope of the invention. Many embodiments of the present invention will become clear to those skilled in the art in light of the methodology of the specification. The scope of the invention is limited only by the claims appended.

What is claimed:

1. A method of fabricating a transistor with reduced hot carrier generation, said method comprising: introducing scattering sites comprised of non-conventional dopants into regions of said transistor, wherein the scattering sites are introduced by in-situ introduction during material deposition.

2. The method of claim 1, wherein said transistor is selected from the group consisting of: vertical bipolar junction transistor, lateral bipolar junction transistor, vertical MOSFET, or lateral MOSFET.

3. The method of claim 1, wherein said transistor region is selected from the group consisting of: the base region, the channel region, and a portion of the channel region.

4. The method of claim 1, wherein concentration of said scattering sites is greater than $10^{17} cm^3$ but less than $10^{20} cm^3$.

* * * * *